(12) United States Patent
Lee et al.

(10) Patent No.: US 9,356,004 B2
(45) Date of Patent: May 31, 2016

(54) LIGHT EMITTING DEVICE ARRAY

(71) Applicant: LG Innotek Co., Ltd., Seoul (KR)

(72) Inventors: Sangwoo Lee, Seoul (KR);
JonDongwook Park, Seoul (KR);
Hongboem Jin, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/269,912

(22) Filed: May 5, 2014

(65) Prior Publication Data

US 2014/0239322 A1 Aug. 28, 2014

Related U.S. Application Data

(62) Division of application No. 13/443,504, filed on Apr. 10, 2012, now Pat. No. 8,791,477.

(30) Foreign Application Priority Data

Apr. 19, 2011 (KR) ........................ 10-2011-0036206

(51) Int. Cl.
*H01L 25/075* (2006.01)
*H01L 33/62* (2010.01)
(Continued)

(52) U.S. Cl.
CPC .............. *H01L 25/075* (2013.01); *H01L 24/97* (2013.01); *H01L 33/62* (2013.01); *H05K 1/0209* (2013.01); *H05K 3/32* (2013.01); *H01L 24/73* (2013.01); *H01L 33/486* (2013.01); *H01L 33/60* (2013.01); *H01L 33/647* (2013.01); *H01L 2224/32245* (2013.01); *H01L 2224/48247* (2013.01); *H01L 2224/48257* (2013.01); *H01L 2224/49107* (2013.01); *H01L 2224/73265* (2013.01);

(Continued)

(58) Field of Classification Search
CPC ....... H01L 25/075; H01L 33/62; H01L 24/97; H05K 1/0209; H05K 3/32
See application file for complete search history.

(56) References Cited

U.S. PATENT DOCUMENTS 5,763,936 A 6/1998 Yamaha et al. ............... 257/644
2007/0001564 A1 1/2007 Park
(Continued)

FOREIGN PATENT DOCUMENTS

| CN | 1893129 A | 1/2007 |
|---|---|---|
| JP | 2003-0602400 | 2/2003 |
| JP | 2006-310123 A | 11/2006 |

OTHER PUBLICATIONS

U.S. Office Action for U.S. Appl. No. 13/443,504 dated Jul. 9, 2013.
(Continued)

*Primary Examiner* — Long Pham
(74) *Attorney, Agent, or Firm* — KED & Associates LLP

(57) ABSTRACT

Disclosed is a light emitting device array. The light emitting device array comprises a light emitting device and a body comprises first and second lead frames electrically connected to the light emitting device and a substrate on which the light emitting device package is disposed, the substrate comprises a base layer and a metal layer disposed on the base layer and electrically connected to the light emitting device package, wherein the metal layer comprises first and second electrode patterns electrically connected to the first and second lead frames and a heat dissipation pattern insulated from at least one of the first or(and) second electrode patterns, absorbing heat generated from at least one of the base layer or(and) the light emitting device package and then dissipating the heat.

16 Claims, 11 Drawing Sheets

(51) Int. Cl.
*H05K 1/02* (2006.01)
*H05K 3/32* (2006.01)
*H01L 23/00* (2006.01)
*H01L 33/48* (2010.01)
*H01L 33/64* (2010.01)
*H05K 1/11* (2006.01)
*H05K 1/18* (2006.01)
*H01L 33/60* (2010.01)

(52) U.S. Cl.
CPC ... *H01L2224/97* (2013.01); *H01L 2924/12035* (2013.01); *H01L 2924/12041* (2013.01); *H05K 1/11* (2013.01); *H05K 1/181* (2013.01); *H05K 2201/09781* (2013.01); *H05K 2201/10106* (2013.01); *H05K 2201/10969* (2013.01)

(56) References Cited

U.S. PATENT DOCUMENTS

| 2009/0168367 | A1 | 7/2009 | Fujii | 361/720 |
| 2009/0190061 | A1 | 7/2009 | Lee et al. | 349/58 |
| 2010/0193807 | A1 | 8/2010 | Park | 257/88 |
| 2010/0283079 | A1* | 11/2010 | Choi et al. | 257/98 |

OTHER PUBLICATIONS

European Search Report issued in Application No. 12163689.8 dated Jul. 28, 2014.
Partial European Search Report for Application 12163689.8 dated May 12, 2014.
Chinese Office Action for Application 201210116861.7 dated Dec. 18, 2015 and full English language Translation.

* cited by examiner

LIGHT EMITTING DEVICE ARRAY

CROSS-REFERENCE TO RELATED APPLICATION

This application is a Divisional application of U.S. patent application Ser. No. 13/443,504, filed Apr. 10, 2012, which claims the priority benefit of Korean Patent Application No. 10-2011-0036206, filed on Apr. 19, 2011 in the Korean Intellectual Property Office, the disclosure of which is disclosure of which are incorporated herein by reference.

BACKGROUND

1. Field

Embodiments relate to a light emitting device array.

2. Description of the Related Art

As one representative example of light emitting devices, light emitting diodes (LEDs) are devices which convert an electrical signal into light, such as infrared light or visible light, using characteristics of a compound semiconductor, and are used in household electric appliances, remote controllers, electronic bulletin boards, displays, various automated machines, etc., and the application range of LEDs continues to expand.

In general, a small LED is fabricated into a surface mount device type in order to be directly mounted on a printed circuit board (PCB), and thus an LED lamp used as a display device is developed into a surface mount device type. Such a surface mount device may substitute for conventional simple lamps, and may be used in a light-on/off display producing various colors, a letter indicator, an image display, etc.

As the application range of LEDs continues to expand, brightness required by a lamp used in a daily life and a lamp for emergency signals is increased, and thus increase in brightness of light emitted from the LEDs becomes a very important issue.

SUMMARY

Embodiments provide a light emitting device array.

In one embodiment, a light emitting device array includes light emitting device packages, each of which includes at least one light emitting device and a body including first and second lead frames electrically connected to the at least one light emitting device, and a substrate on which the light emitting device packages are arranged, the substrate including a base layer and a metal layer arranged on the base layer and electrically connected to the light emitting device packages, wherein the metal layer includes first and second electrode patterns electrically connected to the first and second lead frames, and a heat dissipation pattern insulated from at least one of the first or(and) second electrode patterns, absorbing heat generated from the base layer and the light emitting device packages and then dissipating the heat.

In another embodiment, a light emitting device array includes light emitting device packages, each of which includes at least one light emitting device and a body including first and second lead frames electrically connected to the at least one light emitting device, and a substrate on which the light emitting device packages are arranged, the substrate including a base layer, a metal layer arranged on the base layer and electrically connected to the light emitting device packages, and an insulating layer arranged on the metal layer, wherein the metal layer includes first and second electrode patterns electrically connected to the first and second lead frames, and a heat dissipation pattern insulated from at least one of the first and second electrode patterns, absorbing heat generated from at least one of the base layer or(and) the light emitting device packages and then dissipating the heat, wherein at least one of the length or(and) width of the insulating layer is lower than at least one of the length or(and) width of the base layer.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
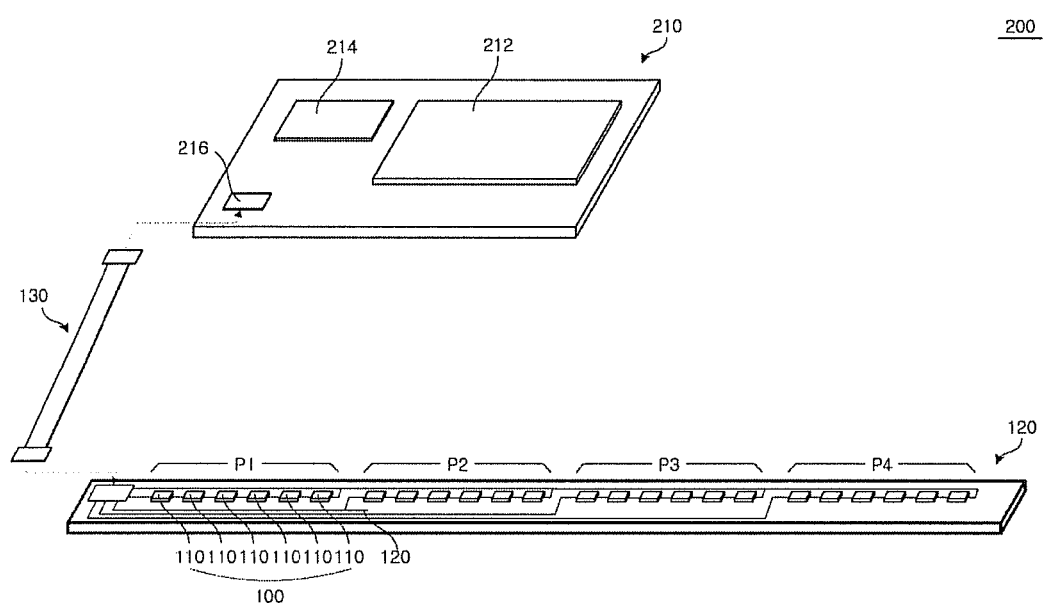
FIG. 1 is an exploded perspective view schematically illustrating a light emitting device module including a light emitting device array in accordance with one embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting device arrays according to embodiments are based on those shown in the drawings. Unless there is, in the specification, no definition of a reference point to describe angular positional relations in the structures of the light emitting device arrays, the associated drawings may be referred to.

FIG. 1 is an exploded perspective view schematically illustrating a light emitting device module including a light emitting device array in accordance with one embodiment.

With reference to FIG. 1, a light emitting device module 200 may include a power control module 210, a light emitting device array 100, and a connector 130.

Here, the power control module 210 may include a power supply 212 to generate power consumed by light emitting device packages 110 mounted on the light emitting device array 100, a controller 214 to control operation of the power supply 212, and a connector interface 216 to which one side of the connector 130 is connected.

Here, the power supply 212 is operated under control of the controller 214, and generates power consumed by the light emitting device array 100.

The controller 214 may control operation of the power supply 212 according to a command input from the outside.

Here, the command input from the outside may be a command output from an input device (not shown) directly connected to a remote controller to command that a device including the light emitting device module 200 is operated and the light emitting device module 200, but the disclosure is not limited thereto.

Further, the connector interface 216 is connected to one side of the connector 130, and may supply the power output from the power supply 212 to the light emitting device array 100 through the connector 130.

The light emitting device array 100 may include the light emitting device packages 110, a substrate 120 on which the light emitting device packages 110 are mounted, and a connector terminal (not shown) connected to the other side of the connector 130 on the substrate 120.

Here, the connector terminal may be electrically connected to the connector interface 216 through the connector 130.

The substrate 120 may be a printed circuit board (PCB), a flexible printed circuit board (FPCB), or a metal core PCB (MCPCB).

The substrate 120 may be a single-sided PCB, a double-sided PCB or a PCB including a plurality of layers. Although the embodiment illustrates the substrate 120 as being a single-sided PCB, the disclosure is not limited thereto.

Although the embodiment illustrates the plural light emitting device packages 110 as being divided into first to fourth groups P1~P4 and each of the first to fourth groups P1~P4 as including six light emitting device packages 110, the disclosure is not limited to the number of the light emitting device packages 110 or the number of groups of the light emitting device packages 110.

That is, the six light emitting device packages 110 in each of the first to fourth groups P1~P4 may be connected in series, and the first to fourth groups P1~P4 may be connected in parallel.

Although the embodiment illustrates that the six light emitting device packages 110 are connected in series to form one group, the disclosure is not limited as to the connection method of the light emitting device packages 110.

As the light emitting device packages 110 within the first to fourth groups P1~P4, at least two light emitting device packages 110 emitting light of different colors may be alternately mounted or may be grouped and mounted according to sizes of the light emitting device packages 110, or the light emitting device packages 110 emitting light of a single color may be mounted. Further, the disclosure is not limited thereto.

For example, if the light emitting device array 100 emits white light, light emitting device packages emitting red light and light emitting device packages emitting blue light may be used as the plural light emitting device packages 110. Therefore, the light emitting device packages emitting red light and the light emitting device packages emitting blue light may be alternately mounted, and may produce red light, blue light and green light.

The power control module 210 shown in FIG. 1 represents a power supply device to supply power, i.e., external power. Further, the power control module 210 may be a device to describe the light emitting device array 100 in accordance with the embodiment, but the disclosure is not limited thereto.

Figure 2:
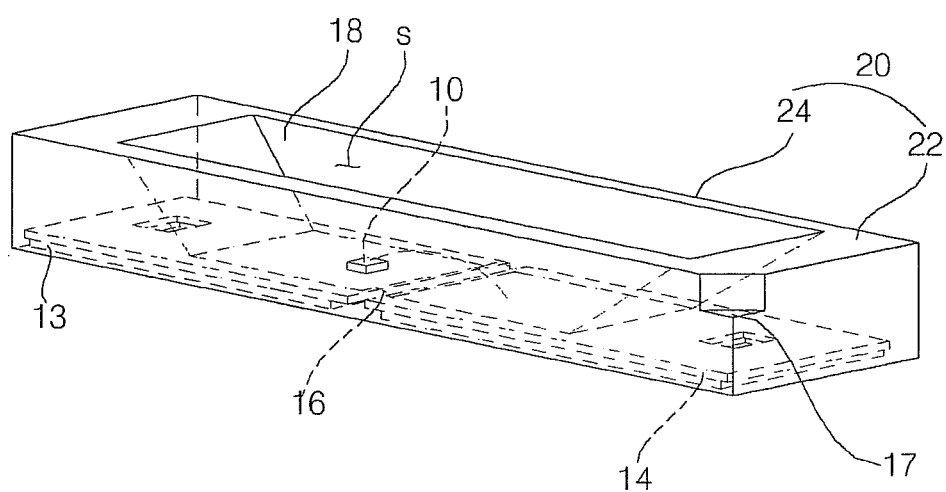
FIG. 2 is a perspective view of a light emitting device package shown in FIG. 1 in accordance with a first embodiment.

FIG. 2 is a perspective view of a light emitting device package shown in FIG. 1 in accordance with a first embodiment.

That is, FIG. 2 is a perspective view of the light emitting device package in which a portion of the light emitting device package is seen through. Although this embodiment illustrates the light emitting device package of a top view type, the light emitting device package may be of a side view type, but the disclosure is not limited thereto.

With reference to FIG. 2, the light emitting device package 110 may include a light emitting device 10 and a body 20 on which the light emitting device 10 is arranged.

The body 20 may include first diaphragms 22 arranged in a first direction (not shown) and second diaphragms 24 arranged in a second direction (not shown) crossing the first direction. The first and second diaphragms 22 and 24 may be formed integrally and be formed through injection molding, etching, etc., but the disclosure is not limited thereto.

That is, the first and second diaphragms 22 and 24 may be formed of at least one selected from the group consisting of a resin, such as polyphthalamide (PPA), silicon (Si), aluminum (Al), aluminum nitride (AlN), $AlO_x$, photo sensitive glass (PSG), polyamide 9T (PA9T), syndiotactic polystyrene (SPS), a metal, sapphire ($Al_2O_3$), beryllium oxide (BeO), ceramic and a printed circuit board (PCB).

The upper surfaces of the first and second diaphragms 22 and 24 may have various shapes, such as a triangle, a rectangle, a polygon and a circle, according to purpose and design of the light emitting device 10, but the disclosure is not limited thereto.

The first and second diaphragms 22 and 24 form a cavity s in which the light emitting device 10 is arranged, the cross-section of the cavity s may have various shapes, such as a cup, a concave container, etc., and the first and second diaphragms 22 and 24 forming the cavity s may be inclined in the downward direction.

Further, the plane of the cavity s may have various shapes, such as a circle, a rectangle, a polygon and an oval, but the disclosure is not limited thereto.

First and second lead frames 13 and 14 may be arranged on the lower surface of the body 20, and the first and second lead frames 13 and 14 may be formed of a metal, for example, at least one selected from the group consisting of titanium (Ti), copper (Cu), nickel (Ni), gold (An), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or an alloy thereof.

Further, the first and second lead frames 13 and 14 may be formed to have a single layer structure or a multi-layer structure, but the disclosure is not limited thereto.

The inner surfaces of the first and second diaphragms 22 and 24 may be inclined at a designated inclination angle from one of the first and second lead frames 13 and 14, the angle of reflection of light emitted from the light emitting device 10 may be varied according to the inclination angle, and thereby, the orientation angle of light emitted to the outside may be adjusted. As the orientation angle of light decreases, convergence of light emitted from the light emitting device 10 to the outside increases and, on the other hand, as the orientation angle of light increases, convergence of light emitted from the light emitting device 10 to the outside decreases.

The inner surface of the body 20 may have plural inclination angles, but the disclosure is not limited thereto.

In the embodiment, a first bonding area (not shown) electrically connected to a first electrode (not shown) of the light emitting device 10 may be formed on the first lead frame 13, and a second bonding area (not shown) electrically connected to a second electrode (not shown) of the light emitting device 10 may be formed on the second lead frame 13.

The first and second bonding areas of the first and second lead frames 13 and 14 are electrically connected to the first and second electrodes of the light emitting device 10 by wires (not shown), and are respectively connected to an anode (+) and a cathode (−) of an external power supply (not shown), thereby being capable of supplying power to the light emitting device 10.

The embodiment illustrates that the second lead frame 14 is separated from the first lead frame 13, and the light emitting device 10 are bonded to the first and second lead frames 13 and 14 by the wires (not shown) and may thus receive power from the first and second lead frames 13 and 14.

Here, the wires are bonded to the bonding areas (not shown) of the first and second lead frames 13 and 14, and one side of each of the wires bonded to the bonding areas may be surrounded with a coating member (not shown), but the disclosure is not limited thereto.

Although the embodiment illustrates the light emitting device 10 as being a horizontal-type light emitting device, the light emitting device 10 may be a vertical-type light emitting device. If the light emitting device 10 is a vertical-type light emitting device, the wires may be bonded to the second bonding area of the second lead frame 14, but the disclosure is not limited thereto.

Here, light emitting devices 10 may be bonded to the first lead frame 13 and the second lead frame 14 with different polarities.

Although the embodiment illustrates the light emitting device 10 as being arranged on the first lead frame 13, the disclosure is not limited thereto.

Further, the light emitting device 10 may be adhered to the upper surface of the first lead frame 13 by an adhesive member (not shown).

Here, an insulating dam 16 to prevent electrical short between the first and second lead frames 13 and 14 may be formed between the first and second lead frames 13 and 14.

Although the embodiment illustrates the insulating dam 16 as having the flat upper surface, the upper surface of the insulating dam 16 may have a semicircular shape, but the disclosure is not limited thereto.

A cathode mark 17 may be formed on the body 20. The cathode mark 17 may serve to identify the polarity of the light emitting device 10, i.e., the polarities of the first and second lead frames 13 and 14, to prevent confusion when the first and second lead frames 13 and 14 are electrically connected.

The light emitting device 10 may be a light emitting diode. For example, such a light emitting diode may be a light emitting diode which emits red, green, blue or white light, or an ultraviolet light emitting diode which emits ultraviolet light, but the disclosure is not limited thereto. Further, plural light emitting devices 10 may be mounted on the first lead frame 13, or at least one light emitting device 10 may be mounted on each of the first and second lead frames 13 and 14, but the disclosure is not limited as to the number of the light emitting devices 10 and the mounting positions of the light emitting devices 10.

The body 20 may include a resin material 18 filling the cavity s. That is, the resin material 18 may be formed in a double molding structure or a triple molding structure, and may include at least one of a phosphor, a light diffusing agent and a light dispersing agent or be formed of a light-transmitting material excluding a phosphor, a light diffusing agent and a light dispersing agent, but the disclosure is not limited thereto.

Figure 3:
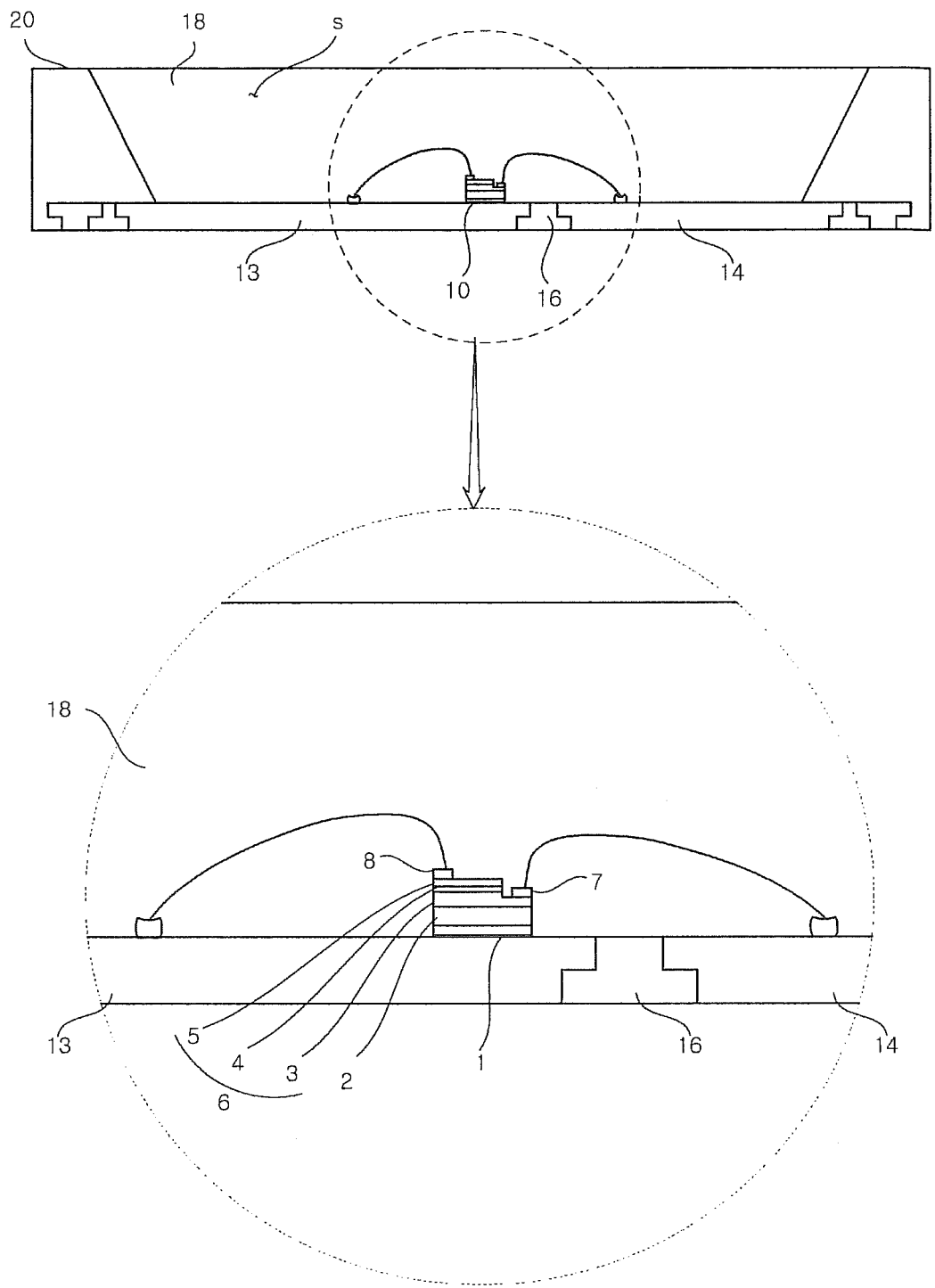
FIG. 3 is a cross-sectional view of the light emitting device package shown in FIG. 2.

FIG. 3 is a cross-sectional view of the light emitting device package shown in FIG. 2.

With reference to FIG. 3, the light emitting device package 110 may include the light emitting device 10 and the body 20 on which the light emitting device 10 is arranged.

Although the embodiment exemplarily illustrates the light emitting device 10 as being of a horizontal type and being arranged on the first lead frame 13, the disclosure is not limited thereto.

The light emitting device 10 may include a support member 2 and a light emitting structure 6 on the support member 2.

The support member 2 is fixed and adhered to the first lead frame 13 by an adhesive member 1, and the adhesive member 1 may be formed of a material having high thermal conductivity, but the disclosure is not limited thereto.

The support member 2 may be formed of a conductive substrate or an insulating substrate, for example, one selected from the group consisting of sapphire ($Al_2O_3$), SiC, Si, GaAs, GaN, ZnO, GaP, InP, Ge and $Ga_2O_3$.

Although the embodiment illustrates the support member 2 as being formed of sapphire ($Al_2O_3$), the disclosure is not limited thereto.

Impurities may be removed from the surface of the support member 2 through wet washing and a light extraction pattern may be formed on the surface of the support member 2 in order to improve light extraction effects, but the disclosure is not limited thereto.

Further, the support member 2 may be formed of a material facilitating discharge of heat to improve thermal stability.

An anti-reflection layer (not shown) to improve light extraction effects may be arranged on the support member 2. The anti-reflection layer (not shown) may be referred to as an anti-reflective (AR) coating layer, and basically uses interference between light reflected by plural interfaces. That is, the anti-reflection layer (not shown) deviates phases of light reflected by different interfaces from one another by an angle of 180 degrees to offset the light, thereby decreasing intensity of the reflected light. However, the disclosure is not limited thereto.

Further, a buffer layer (not shown) may be arranged on the support member 2 so as to reduce lattice mismatch between the support member 2 and the light emitting structure 6 and to enable plural semiconductor layers to be easily grown.

The buffer layer may be grown to produce single crystals on the support member 2, and the buffer layer having single crystals may improve crystallinity of the light emitting structure 6 grown on the buffer layer.

Further, the buffer layer may be formed to have a structure including AlN and GaN, such as an AlInN/GaN stacked structure, an InGaN/GaN stacked structure or an AlInGaN/InGaN/GaN stacked structure.

A first semiconductor layer 3 may be arranged on the support member 2 or the buffer layer, and, if the first semiconductor layer 3 is an N-type semiconductor layer, the first semiconductor layer 3 may be formed of a semiconductor material having a formula of $In_xAl_yGa_{1-x-y}N$ ($0 \leq x \leq 1$, $0 \leq y \leq 1$ $0 \leq x+y \leq 1$), for example, one selected from the group consisting of GaN, AlN, AlGaN, InGaN, InN, InAlGaN and AlInN, and may be doped with an N-type dopant, such as Si, Ge, Sn, Se or Te.

The first semiconductor layer 3 includes first and second areas (not shown), and an active layer 4 may be arranged on the first semiconductor layer 3 in the second area and be formed in a single quantum well structure, a multi-quantum well (MQW) structure, a quantum wire structure or a quantum dot structure using a group III-V compound semiconductor material.

If the active layer 4 is formed in a quantum well structure, the active layer 4 may be formed in a single quantum well structure or a multi-quantum well structure including well layers having a formula of $In_xAl_yGa_{1-x-y}N$ ($0 \leq x \leq 1$, $0 \leq y \leq 1$ $0 \leq x+y \leq 1$) and barrier layers having a formula of $In_aAl_bGa_{1-a-b}N$ ($0 \leq a \leq 1$, $0 \leq b \leq 1$ $0 \leq a+b \leq 1$). The well layers may be formed of a material having a lower band gap than the band gap of the barrier layers.

A conductive clad layer (not shown) may be formed on the upper surface and/or the lower surface of the active layer 4. The conductive clad layer (not shown) may be formed of an AlGaN-based semiconductor and have a higher band gap than the band gap of the active layer 4.

A second semiconductor layer 5 may be arranged on the active layer 4 and be a P-type semiconductor layer, and if the second semiconductor layer 5 is a P-type semiconductor layer, the second semiconductor layer 5 may be formed of a semiconductor material having a formula of $In_xAl_yGa_{1-x-y}N$ ($0 \leq x \leq 1$, $0 \leq y \leq 1$ $0 \leq x+y \leq 1$), for example, one selected from the group consisting of GaN, AlN, AlGaN, InGaN, InN, InAlGaN and AlInN, and may be doped with a P-type dopant, such as Mg, Zn, Ca, Sr or Ba.

The above-described first semiconductor layer 3, active layer 4 and second semiconductor layer 5 may be formed, for example, through metal organic chemical vapor deposition (MOCVD), chemical vapor deposition (CVD), plasma-enhanced chemical vapor deposition (PECVD), molecular beam epitaxy (MBE) or hydride vapor phase epitaxy (HVPE), but the disclosure is not limited thereto.

Further, doping concentrations of the N-type dopant and the P-type dopant within the first semiconductor layer 3 and the second semiconductor layer 5 may be uniform or non-uniform. That is, the plural semiconductor layers may be formed in various structures, but the disclosure is not limited thereto.

Further, the first semiconductor layer 3 may be a P-type semiconductor layer, the second semiconductor layer 5 may be an N-type semiconductor layer, and thereby, the light emitting structure 6 may include at least one of N-P junction, P-N junction, N-P-N junction and P-N-P junction structures.

In the embodiment, the first and second areas of the first semiconductor layer 3 may be formed by MESA etching after growth of the light emitting structure 6, and the first area may be the first semiconductor layer 3 which is exposed after MESA etching.

Here, a first electrode 7 electrically connected to the first semiconductor layer 3 may be arranged on the first semiconductor layer 3 in the first area, and a second electrode 8 electrically connected to the second semiconductor layer 5 may be arranged on the second semiconductor layer 5.

At least one of the first and second electrodes 7 and 8 may be formed of at least one selected from the group consisting of indium (In), cobalt (Co), silicon (Si), germanium (Ge), gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chromium (Cr), molybdenum (Mo), niobium (Nb), aluminum (Al), nickel (Ni), copper (Cu) and tungsten-titanium (WTi), or an alloy thereof, but the disclosure is not limited thereto.

Here, the first and second electrodes 7 and 8 may be formed in at least one layer, but the disclosure is not limited thereto.

Further, at least one of a light-transmitting electrode layer (not shown) and a reflective layer (not shown) may be formed between the light emitting structure 6 and the second electrode 8 and between the first semiconductor layer 3 and the first electrode 7, but the disclosure is not limited thereto.

The first electrode 7 may be bonded to the second lead frame 14 by a wire, and the second electrode 8 may be bonded to the first lead frame 13 by a wire.

Here, the resin material 18 may fill the cavity s formed on the body 20 to cover the light emitting device 10 and to protect the light emitting device 10.

Figure 4:
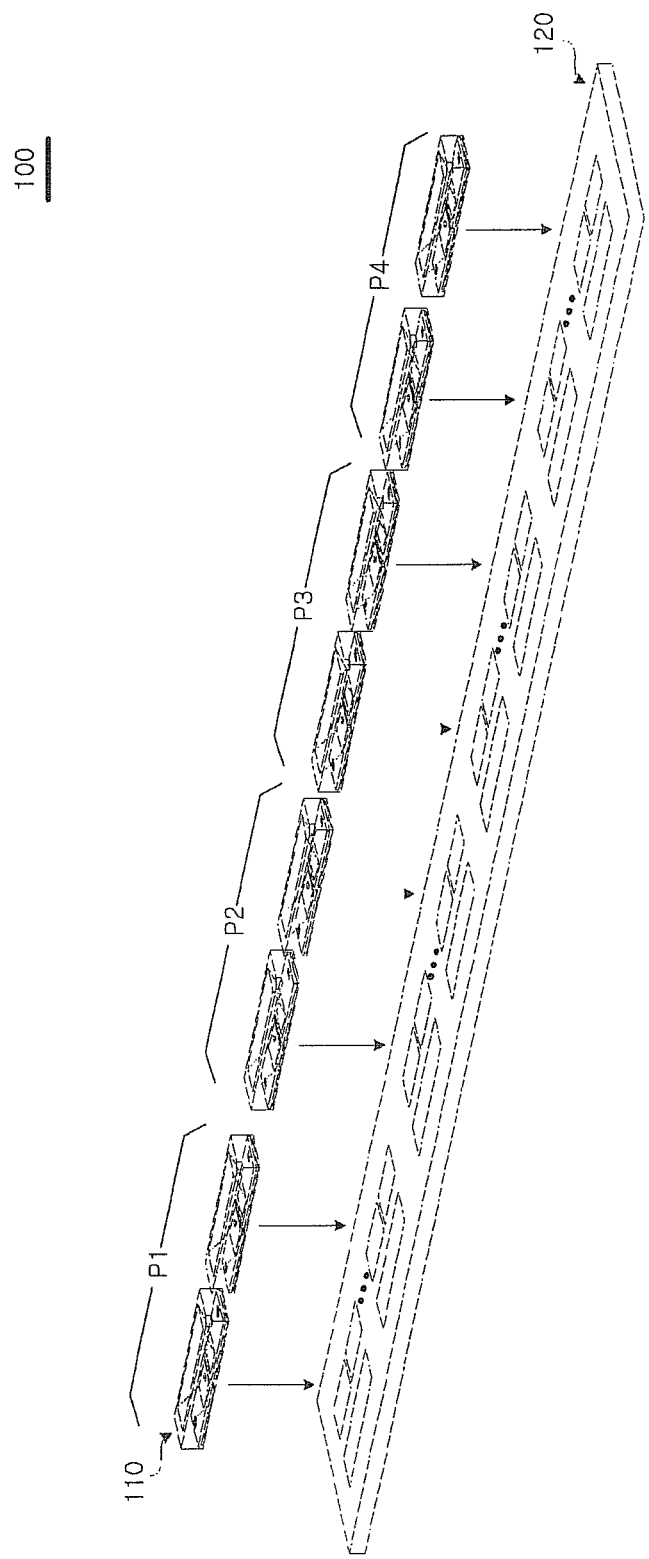
FIG. 4 is an exploded perspective view of the light emitting device array shown in FIG. 1.
Figure 5:
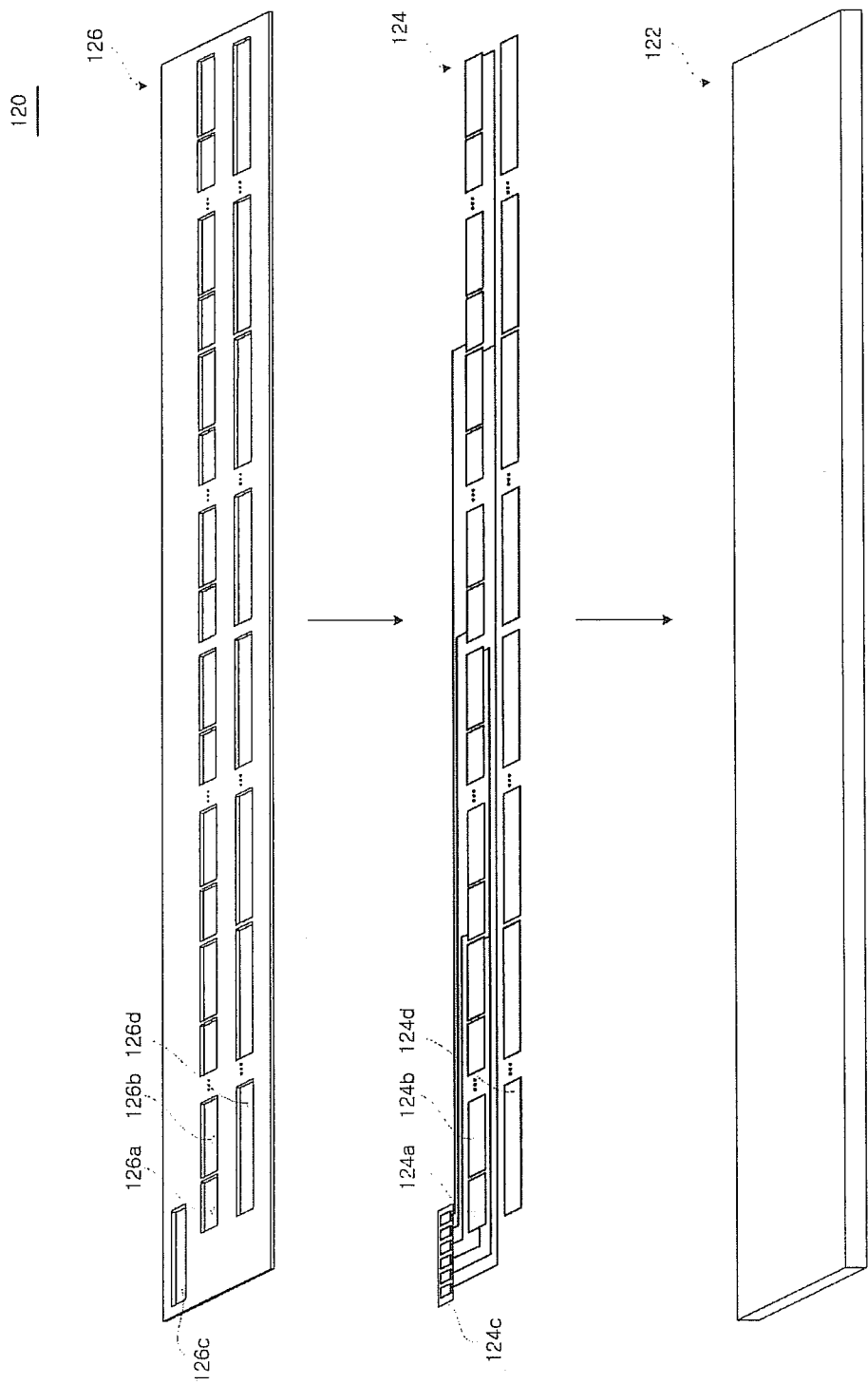
FIG. 5 is an exploded perspective view of a substrate shown in FIG. 4.

FIG. 4 is an exploded perspective view of the light emitting device array shown in FIG. 1, and FIG. 5 is an exploded perspective view of the substrate shown in FIG. 4.

With reference to FIG. 4, the light emitting device array 100 may include the light emitting device packages 110 and the substrate 120 on which the light emitting device packages 110 are mounted.

The embodiment illustrates the light emitting device packages 110 as the light emitting device packages 110 shown in FIGS. 2 and 3.

In the embodiment, the plural light emitting device packages 110 are divided into the first to fourth groups P1~P4, as shown in FIG. 1, and FIG. 4 illustrates that each of the first to fourth groups P1~P4 includes two light emitting device packages 110 for convenience of description.

That is, at least one light emitting device package 110 forms an array, but the disclosure is not limited thereto.

The substrate 120 may be a printed circuit board (PCB), a flexible printed circuit board, or a metal core PCB (MCPCB). If the substrate 120 is a PCB, a single-sided PCB, a double-sided PCB or a PCB including a plurality of layers may be used. Although the embodiment illustrates the substrate 120 as being a single-sided PCB, the disclosure is not limited thereto.

With reference to FIG. 5, the substrate 220 may include a base layer 122, a metal layer 224, and an insulating layer 226.

Although the embodiment illustrates that the substrate 120 uses the base layer 122 formed of FR4, the substrate 120 may be an MCPCB including at least one of aluminum (Al) and copper (Cu), and if the substrate 220 is the MCPCB, an insulating member (not shown) may be arranged between the base layer 222 and the metal layer 224, but the disclosure is not limited thereto.

The metal layer 124 supplying power to the light emitting device packages 110 may be arranged on the base layer 122.

Here, the metal layer 124 may include first and second patterns 124a and 124b electrically connected to first and second lead frames 13 and 14 of the light emitting device packages 110 shown in FIG. 2, a connector pattern 124c of a connector terminal (not shown) on which the connector (not shown) shown in FIG. 1 is arranged, and a heat dissipation pattern 124d arranged to be insulated from the first and second electrode patterns 124a and 124b and the connector pattern 124c. A description of the heat dissipation pattern 124d will be given later.

The metal layer 124 may further include a connection pattern (not shown) connecting the first and second electrode patterns 124a and 124b and the connector pattern 124c.

The insulating layer 126 including at least one of a PSR ink and an insulating film to prevent corrosion and short of the metal layer 124 and to increase efficiency and reflectivity of light emitted from the light emitting device packages 110 may be arranged on the base layer 122 and the metal layer 124.

The insulating layer 126 may includes first and second electrode open areas 126a and 126b, a connector open area 126c and heat dissipation open areas 126d through which the first and second electrode patterns 124a and 124b, the connector pattern 124c and the heat dissipation pattern 124d are exposed to the outside.

Although the embodiment illustrates at least one of the length or(and) width of the insulating layer 126 as being equal to at least one of the length or(and) width of the base layer 122, at least one of the length or(and) width of the insulating layer 126 may be smaller than at least one of the length or(and) width of the base layer 122 to prevent cracking or damage to edge parts of the insulating layer 126, but the disclosure is not limited thereto.

That is, the insulating layer 126 may have a sheet shape, and the first and second electrode open areas 126a and 126b, the connector open area 126c and the heat dissipation open areas 126d may be formed on the insulating layer 125 through an etching process.

Here, the first and second lead frames 13 and 14 of the light emitting device packages 110 and the connector may be arranged on the first and second electrode patterns 124a and 124b and the connector pattern 124c exposed through the first and second electrode open areas 126a and 126b and the connector open area 126c.

A cream solder (not shown) for electrical connection may be arranged between the first and second electrode patterns 124a and 124b and the connector pattern 124c exposed through the first and second electrode open areas 126a and 126b and the connector open area 126c and between the first and second lead frames 13 and 14 and the connector.

Further, a thermally conductive member (not shown) may be arranged on the heat dissipation pattern 124d exposed through heat dissipation open areas 126d. The thermally conductive member may be formed of a material having higher thermal conductivity than the base layer 122, for example, plumbum (Pd) or a cream solder including plumbum (Pd), but the disclosure is not limited thereto. One surface of the thermally conductive member may contact the insulating layer 126.

Figure 6:
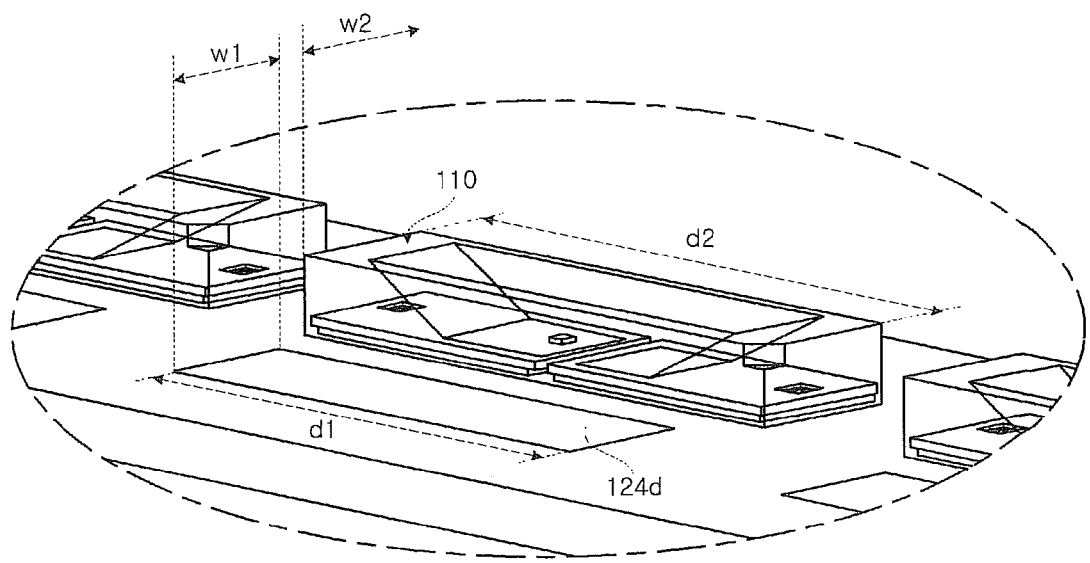
FIG. 6 is an enlarged view of a portion of the light emitting device array shown in FIG. 4.

FIG. 6 is an enlarged view of a portion of the light emitting device array shown in FIG. 4.

With reference to FIG. 6, the light emitting device array 100 may be configured such that the light emitting device packages 110 are arranged on the substrate 120.

Here, FIG. 6 is an enlarged view of a portion of FIG. 4, illustrating the light emitting device packages 110 as being arranged on the substrate 120.

Although the embodiment illustrates the heat dissipation pattern 124d as being separated from the light emitting device package 110, at least a portion of the heat dissipation pattern 124d may overlap the lower portion of the light emitting device package 110, but the disclosure is not limited thereto.

That is, although the embodiment illustrates the light emitting device package 110 of a top view type, if the light emitting device package 110 is of a side view type, there may be a separation distance between the first and second lead frames and a light emitting surface and thus the heat dissipation pattern 124d may overlap the lower portion of the light emitting device package 110.

Here, the width w1 of the heat dissipation pattern 124d may be is 0.7 to 1.2 times less than the width w2 of the light emitting device package 110. Although the width w1 of the heat dissipation pattern 124d may be varied according to the width (not shown) of the base layer 122, the width w1 of the heat dissipation pattern 124d may be equal to or greater than the width w2 of the light emitting device package 110 in order to directly or indirectly absorb heat generated from the light emitting device package 110.

Further, the length d1 of the heat dissipation pattern 124d may be 0.7 to 1.1 times greater than the length d2 of the light emitting device package 110, but the disclosure is not limited thereto.

Although the embodiment illustrates one piece of the heat dissipation pattern 124d as being formed per one light emitting device package 110, one piece of the heat dissipation pattern 124d may be formed per at least two light emitting device packages 110, but the disclosure is not limited thereto.

Further, although the embodiment illustrates the heat dissipation pattern 124d as being insulated from the first and second electrode patterns 124a and 124b electrically connected to the first and second lead frames 13 and 14 of the light emitting device packages 110, the heat dissipation pattern 124d may be electrically connected to the electrode pattern (not shown) to which negative voltage (−) of power is supplied from among the first and second electrode patterns 124a and 124b, but the disclosure is not limited thereto.

Further, although the embodiment illustrates the light emitting device package 110 as including two lead frames, i.e., the first and second lead frames 13 and 14, if the light emitting device package 110 further includes a third lead frame (not shown) on which the light emitting device 10 is arranged in addition to the first and second lead frames 13 and 14, the heat dissipation pattern 124d may be electrically connected to the third lead frame, but the disclosure is not limited thereto.

Here, the thermally conductive member (not shown) may be arranged on the heat dissipation pattern 124d, and the thickness of the thermally conductive member may be 0.1 to 0.3 times less than the thickness of the light emitting device package 110.

The thermally conductive member may prevent the heat dissipation pattern 124d from being exposed to the outside, thereby preventing the heat dissipation pattern 124d from being oxidized.

Figure 7:
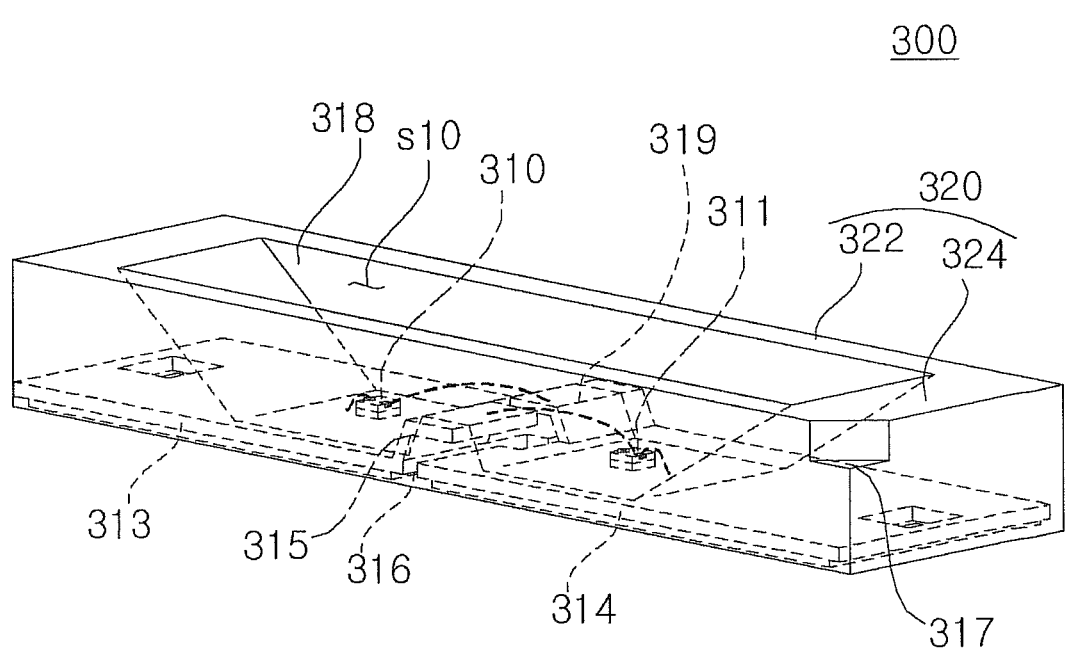
FIG. 7 is a perspective view of a light emitting device package shown in FIG. 1 in accordance with a second embodiment.
Figure 8:
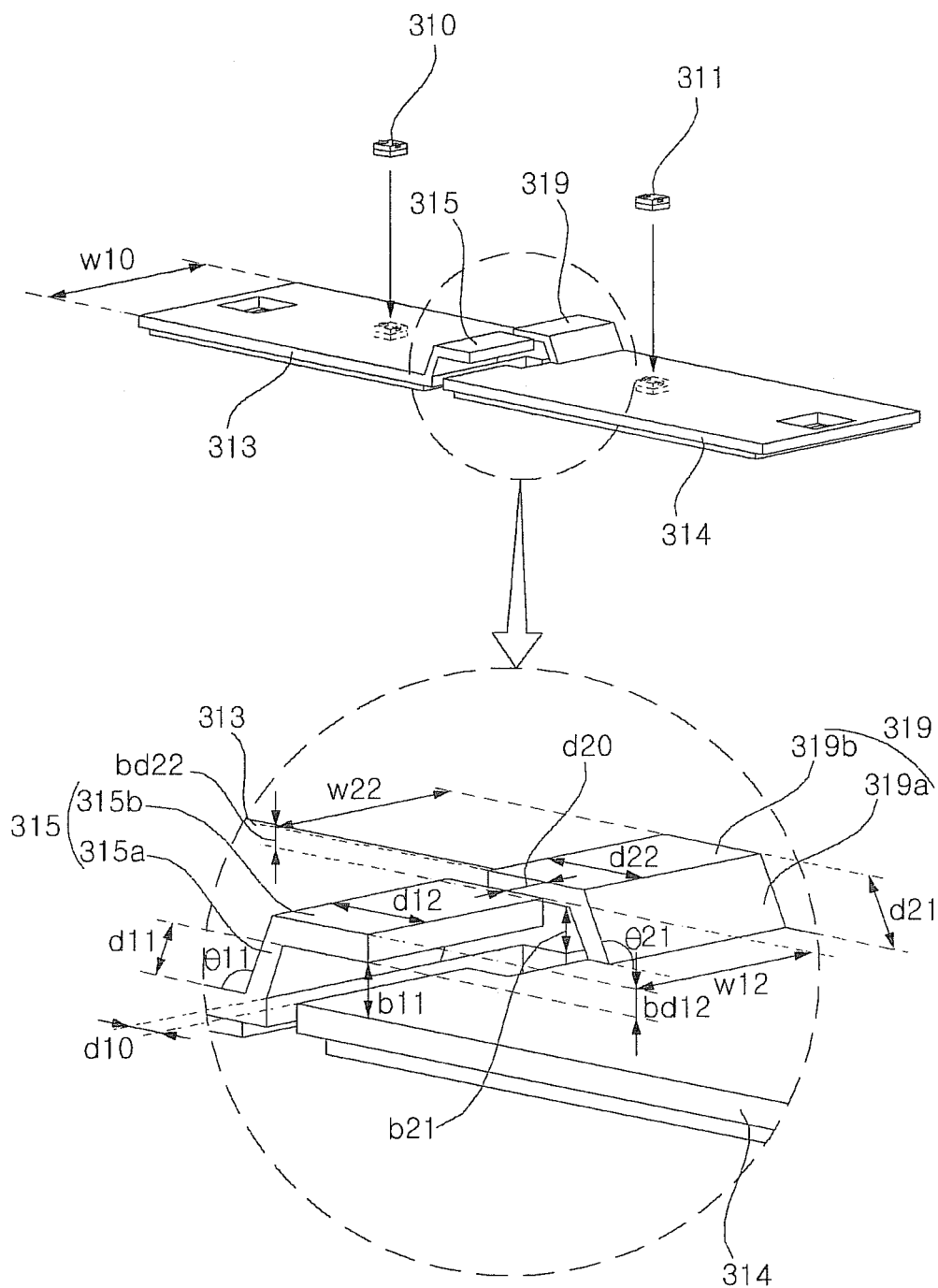
FIG. 8 is an enlarged view illustrating first and second lead frames shown in FIG. 7.

FIG. 7 is a perspective view of a light emitting device package shown in FIG. 1 in accordance with a second embodiment, and FIG. 8 is an enlarged view illustrating first and second lead frames shown in FIG. 7.

That is, FIG. 7 is a perspective view of a light emitting device package 300 in which a portion of the light emitting device package 300 is seen through. Although this embodiment illustrates the light emitting device package 300 of a top view type, the light emitting device package 300 may be of a side view type, but the disclosure is not limited thereto.

With reference to FIG. 7, the light emitting device package 300 may include first and second emitting devices 310 and 311 and a body 320 on which the first and second light emitting devices 310 and 311 are arranged.

The body 320 may include first diaphragms 222 arranged in a first direction (not shown) and second diaphragms 324 arranged in a second direction (not shown) crossing the first direction. The first and second diaphragms 322 and 324 may be formed integrally and be formed through injection molding, etching, etc., but the disclosure is not limited thereto.

The upper surfaces of the first and second diaphragms 322 and 324 may have various shapes, such as a triangle, a rectangle, a polygon and a circle, according to purpose and design of the first and second light emitting devices 310 and 311, but the disclosure is not limited thereto.

The first and second diaphragms 322 and 324 form a cavity s10 in which the first and second light emitting devices 310 and 311 are arranged, the cross-section of the cavity s10 may have various shapes, such as a cup, a concave container, etc., and the first and second diaphragms 322 and 324 forming the cavity s10 may be inclined in the downward direction.

Further, the plane of the cavity s10 may have various shapes, such as a circle, a rectangle, a polygon and an oval, but the disclosure is not limited thereto.

First and second lead frames 313 and 314 may be arranged on the lower surface of the body 320, and the first and second lead frames 313 and 314 may be formed of a metal, for example, at least one selected from the group consisting of titanium (Ti), copper (Cu), nickel (Ni), gold (An), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or an alloy thereof.

Further, the first and second lead frames 313 and 314 may be formed to have a single layer structure or a multi-layer structure, but the disclosure is not limited thereto.

The first light emitting device 310 is arranged on the first lead frame 313, and the first lead frame 313 may include a first overlap protrusion 315 overlapping at least a portion of the second lead frame 314.

The second light emitting device 311 is arranged on the second lead frame 314, and the second lead frame 314 may include a second overlap protrusion 319 overlapping at least a portion of the first lead frame 313.

Although the embodiment illustrates the first lead frame 313 as including the first overlap protrusion 315 at a position at which a groove (not shown) is formed close to the side surface of the adjacent second lead frame 314 and illustrates the second lead frame 314 as including a protrusion (not shown) protruding in the direction of the groove, the disclosure is not limited thereto.

Further, although the embodiment illustrates the second lead frame 314 as including the second overlap protrusion 319 at a position at which a groove (not shown) is formed close to the side surface of the adjacent first lead frame 313 and illustrates the first lead frame 313 as including a protrusion (not shown) protruding in the direction of the groove, the disclosure is not limited thereto.

The first and second overlap protrusions 315 and 319 may be formed in parallel, but the disclosure is not limited thereto.

The grooves and the protrusions may be omitted and have other shapes, the side surfaces of the first and second lead frames 313 and 314 adjacent to each other may have a bent or uneven shape, as seen from the top, but the disclosure is not limited thereto.

Here, the first and second overlap protrusions 315 and 319 are formed at one side surface of each of the first and second lead frames 313 and 314, but one of the first and second overlap protrusions 315 and 319 may be formed at the center of the first or second lead frame 313 or 314 and the disclosure is not limited as to the size and number of the first and second overlap protrusions 315 and 319.

A detailed description of the structures of the first and second lead frames 313 and 314 and the first and second overlap protrusions 315 and 319 will be given later.

The inner surfaces of the first and second diaphragms 322 and 324 may be inclined at a designated inclination angle from one of the first and second lead frames 313 and 14, the angle of reflection of light emitted from the first and second light emitting devices 310 and 311 may be varied according to the inclination angle, and thereby, the orientation angle of light emitted to the outside may be adjusted. As the orientation angle of light decreases, convergence of light emitted from the first and second light emitting devices 310 and 311 to the outside increases and, on the other hand, as the orientation angle of light increases, convergence of light emitted from the first and second light emitting devices 310 and 311 to the outside decreases.

The first and second lead frames 313 and 314 are electrically connected to first and second electrodes of the first and second light emitting devices 310 and 311, and are respectively connected to an anode (+) and a cathode (−) of an external power supply (not shown), thereby being capable of supplying power to the first and second light emitting devices 310 and 311.

Here, although the embodiment illustrates the first and second light emitting devices 310 and 311 as being connected in parallel, the disclosure is not limited thereto. Further, although the embodiment illustrates the first and second light emitting devices 310 and 311 as being arranged on the flat surfaces of the first and second lead frames 313 and 314, the first and second light emitting devices 310 and 311 may be respectively arranged on the first and second overlap protrusions 315 and 319, but the disclosure is not limited thereto.

Further, the first and second light emitting devices 310 and 311 may be adhered to the upper surfaces of the first and second lead frames 313 and 314 by an adhesive member (not shown), and a detailed description of the adhesive member will be given later.

A cathode mark 317 may be formed on the body 320. The cathode mark 317 may serve to identify the polarities of the first and second light emitting devices 310 and 311, i.e., the polarities of the first and second lead frames 313 and 314, to prevent confusion when the first and second lead frames 313 and 314 are electrically connected.

The first and second light emitting devices 10 may be light emitting diodes. For example, such a light emitting diode may be a light emitting diode which emits red, green, blue or white light, or an ultraviolet light emitting diode which emits ultraviolet light, but the disclosure is not limited thereto. Further, plural first and second light emitting devices 310 and 311 may be mounted on the first and second lead frames 313 and 314, or at least one light emitting device 310 or 311 may mounted on each of the first and second lead frames 313 and 314, but the disclosure is not limited as to the number of the first and second light emitting devices 310 and 311 and the mounting positions of the first and second light emitting devices 310 and 311.

Here, an insulating dam 316 to prevent electrical short between the first and second lead frames 313 and 314 may be formed between the first and second lead frames 313 and 314.

In the embodiment, the first and second overlap protrusions 315 and 319 may form at least a portion of the insulating dam 316 and the insulting dam 316 may have the same cross-sectional shape as the first and second overlap protrusions 315 and 319, but the disclosure is not limited thereto.

That is, the insulating dam 316 has a trapezoidal cross-sectional shape which is symmetrical corresponding to the shape of the first and second overlap protrusions 315 and 319, as shown in FIG. 7, but the disclosure is not limited thereto.

The body 320 may include a resin material 318 filling the cavity s10. That is, the resin material 318 may be formed in a double molding structure or a triple molding structure, but the disclosure is not limited thereto.

Further, the resin material 318 may be formed in a film type, may include at least one of a phosphor, a light diffusing agent and a light dispersing agent or be formed of a light-transmitting material excluding a phosphor, a light diffusing agent and a light dispersing agent, for example, silicon, but the disclosure is not limited thereto.

FIG. 8 illustrates the first and second light emitting devices 310 and 311 shown in FIG. 7 as having the same configuration as the light emitting device 10 shown in FIG. 3 and illustrates the first and second light emitting devices 310 and 311 as emitting light of different colors, but the disclosure is not limited thereto.

The first lead frame 313 may be separated from the second lead frame 314 by a separation distance d10.

Although the embodiment exemplarily illustrates the separation distance d10 between the first and second lead frames 313 and 314 as being regular, at least a portion of the first and second lead frames 313 and 314 may have a different separation distance, but the disclosure is not limited thereto.

The grooves (not shown) and the protrusions (not shown) may be formed at the first and second lead frames 313 and 314, but the disclosure is not limited thereto.

Here, the first lead frame 313 may include the first overlap protrusion 315 overlapping at least a portion of the second lead frame 314.

Further, the second lead frame 314 may include the second overlap protrusion 319 overlapping at least a portion of the first lead frame 313.

Although the embodiment exemplarily illustrates the first and second overlap protrusions 315 and 319 as having the same size, the first and second overlap protrusions 315 and 319 may have different sizes, but the disclosure is not limited thereto.

That is, the first overlap protrusion 315 may include a first protrusion part 315a formed in a first direction with respect to the surface of the second lead frame 314, and a first extension part 315b extending from the first protrusion part 315a in a second direction crossing the first direction.

The first protrusion part 315a may have an inclination angle θ11 of 90° to 150° from the surface of the first lead frame 313, and may have an inclination angle of 30° to 90° from the surface of the second lead frame 314.

Here, the inclination angle θ11 serves to maintain an angle of reflection of light, emitted from the first light emitting device 310, by the surface of the first lead frame 313 along the side surface of the first protrusion part 315a, and may be equal to the inclination angle of the inner surface of the cavity s10 of the body 320, but the disclosure is not limited thereto.

The length d11 of the first protrusion part 315a may be 1 to 4 times the thickness (not shown) of at least one of the first and second light emitting devices 310 and 311.

That is, if the length d11 of the first protrusion part 315a is below 1 times the thickness of at least one of the first and second light emitting devices 310 and 311, the first protrusion 315a may contact the surface of the second lead frame 314 and thus cause short, and if the length d11 of the first protrusion part 315a exceeds 4 times the thickness of at least one of the first and second light emitting devices 310 and 311, the first protrusion part 315a is distant from the surface of the second lead frame 314 and thus the size of the body 320 may be increased.

The first extension part 315b may extend from the first protrusion part 315a in the second direction of overlapping the surface of the second lead frame 314.

Here, the width w12 of the first extension part 315b may be equal to the width of the first protrusion part 315a or be greater than the width of the first protrusion part 315a, and may be 0.1 to 0.4 times the width w10 of the first and second lead frames 313 and 314.

That is, if the width w12 of the first extension part 315b is below 0.1 times the width w10 of the first and second lead frames 313 and 314, deformation of the first overlap protrusion 315 may occur, and if the width w12 of the first extension part 315b exceeds 0.4 times the width w10 of the first and second lead frames 313 and 314, short between the first overlap protrusion 315 and the second overlap protrusion 319 may occur.

The length d2 of the first extension part 315b may be 1.1 to 3 times the separation distance d10 between the first and second lead frames 313 and 314.

That is, if the length d2 of the first extension part 315b is below 1.1 times the separation distance d10 between the first and second lead frames 313 and 314, the first extension part 315b may have a difficulty in overlapping at least a portion of the second lead frame 314, it may be difficult to form the insulating dam 316 on the second lead frame 314 and thus stiffness of the body 320 may be lowered, and if the length d2 of the first extension part 315b exceeds times the separation distance d10 between the first and second lead frames 313 and 314, an overlapping area of the first extension part 315b with at least a portion of the second lead frame 314 is increased but the volume of the cavity s10 is decreased and thus dark regions may occur due to non-uniformity of light emitted from the first and second light emitting devices 310 and 311.

The thickness bd12 of the first extension part 315b may be 1 to 2 times the thickness of the first lead frame 313.

That is, if the thickness bd12 of the first extension part 315b is below 1 times the thickness of the first lead frame 313, the first extension part 315b may be easily deformed, and if the thickness bd12 of the first extension part 315b exceeds 2 times the thickness of the first lead frame 313, the first extension part 315b is difficult to be deformed but there is a high possibility of the lower surface of the first extension part 315b contacting at least a portion of the second lead frame 314.

The separation distance b11 between the first extension part 315b and the second lead frame 314 may be 0.5 to 4 times the separation distance d10 between the first and second lead frames 313 and 314.

That is, if the separation distance b11 is below 0.5 times the separation distance d10, the lower surface of the first extension part 315b may contact the surface of the second lead frame 314, and if the separation distance b11 exceeds 4 times the separation distance d10, the size of the body 320 may be increased.

The second overlap protrusion 319 may include a second protrusion part 319a formed in a first direction with respect to the surface of the first lead frame 313, and a second extension part 319b extending from the second protrusion part 319a in a second direction crossing the first direction.

The second protrusion part 319a may have an inclination angle θ21 of 90° to 150° from the surface of the second lead frame 314, and may have an inclination angle of 30° to 90° from the surface of the first lead frame 313.

Here, the inclination angle θ21 serves to maintain an angle of reflection of light, emitted from the second light emitting device 311, by the surface of the second lead frame 314 along the side surface of the second protrusion part 319a, and may be equal to the inclination angle of the inner surface of the cavity s10 of the body 320, but the disclosure is not limited thereto.

The length d21 of the second protrusion part 319a may be equal to the length d11 of the first protrusion part 315a, and a detailed description thereof will thus be omitted.

The second extension part 319b may extend from the second protrusion part 319a in the second direction of overlapping the surface of the first lead frame 313.

Here, the width w22, the length d22 and the thickness bd22 of the second extension part 319b may be equal to the width w12, the length d12 and the thickness bd12 of the first extension part 315b.

Although the embodiment illustrates the first and second protrusion parts 315a and 319a and the first and second extension parts 315b and 319b as being equal to each other, the first and second protrusion parts 315a and 319a and the first and second extension parts 315b and 319b may differ from each other, but the disclosure is not limited thereto.

Further, the separation distance d20 between the side surfaces of the first and second extension parts 315b and 319b may be equal to the separation distance d10 between the first and second lead frames 313 and 314 or be greater than the separation distance d10 between the first and second lead frames 313 and 314, but the disclosure is not limited thereto.

Although the embodiment exemplarily illustrates the first and second light emitting devices 310 and 311 as being arranged on the flat surfaces of the first and second lead frames 313 and 314, the first and second light emitting devices 310 and 311 may be respectively arranged on the first and second overlap protrusions 315 and 319.

Further, if one vertical-type or horizontal-type light emitting device is arranged in the light emitting device package 300, such a light emitting device may be arranged on one of the first and second overlap protrusions 315 and 319, as shown in FIG. 1, and if one flip-type light emitting device is arranged in the light emitting device package 300, first and second electrodes of such a light emitting device may be bonded to the first and second overlap protrusions 315 and 319, but the disclosure is not limited thereto.

Further, the disclosure is not limited as to the number and arrangement shape of the first and second overlap protrusions 315 and 319, and the first and second overlap protrusions 315 and 319 may overlap the second and first lead frames 314 and 313 to increase stiffness of the insulating dam 316.

Further, a Zener diode (not shown) may be arranged on one of the first and second overlap protrusions 315 and 319, but the disclosure is not limited thereto.

Figure 9:
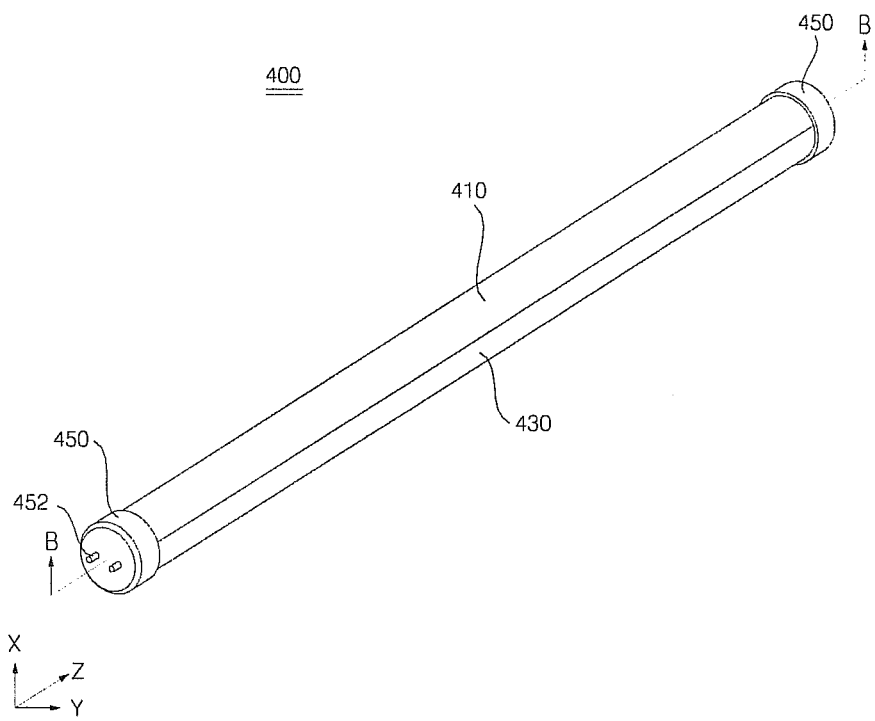
FIG. 9 is a perspective view of a lighting apparatus including a light emitting device array in accordance with one embodiment.
Figure 10:
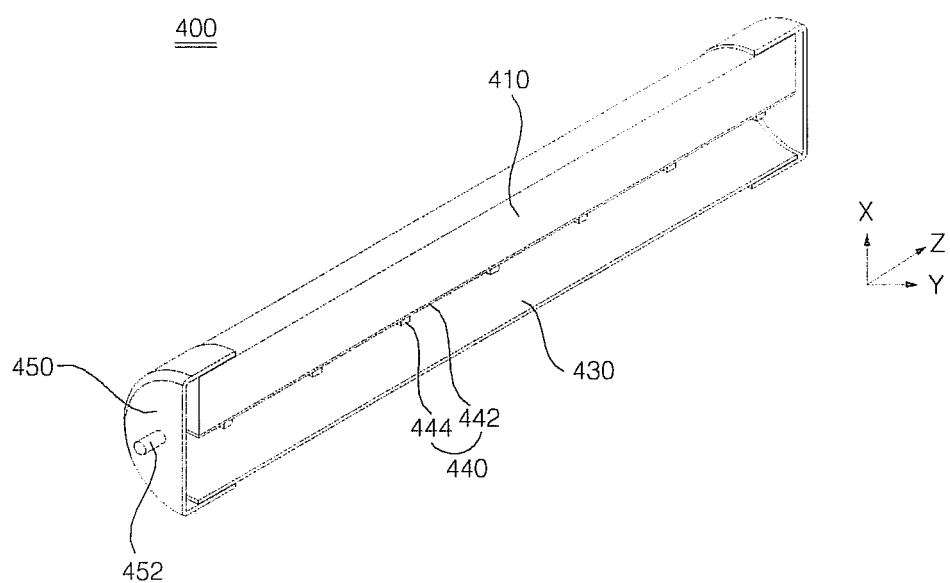
FIG. 10 is a cross-sectional view taken along the line B-B of the lighting apparatus of FIG. 9.

FIG. 9 is a perspective view of a lighting apparatus including a light emitting device array in accordance with one embodiment, and FIG. 10 is a cross-sectional view taken along the line B-B of the lighting apparatus of FIG. 9.

Hereinafter, in order to illustrate the shape of a lighting apparatus 400 in accordance with this embodiment in more detail, a length direction Z of the lighting apparatus 400, a horizontal direction Y perpendicular to the lengthwise direction Z, and a height direction X perpendicular to the length direction Z and the horizontal direction Y will be described.

That is, FIG. 10 is a cross-sectional view obtained by cutting the lighting apparatus 400 of FIG. 9 along the planes in the length direction Z and the height direction X, as seen in the horizontal direction Y.

With reference to FIGS. 9 and 10, the lighting apparatus 400 includes a body 410, a cover 430 coupled to the body 410, and end caps 450 located at both ends of the body 410.

A light emitting device module 440 is coupled to the lower surface of the body 410, and the body 410 may be formed of a metal having excellent conductivity and heat dissipation effects so as to discharge heat generated by light emitting device packages 444 to the outside through the upper surface of the body 540.

Roughness (not shown) may be formed on respective lead frames (not shown) of the light emitting device packages 444 so as to improve reliability in bonding and light emitting efficiency and to be capable of implementing a slim and small display apparatus.

The light emitting device module 440 may include a light emitting device array (not shown) including the light emitting device packages 444 and a PCB 442 on which the light emitting device packages 444 emitting light of multiple colors are mounted in multiple rows. The light emitting device packages 444 may be mounted on the PCB 442 by the same interval or by various separation distances as needed, thereby being capable of adjusting brightness. As the PCB 442, a metal core PCB (MCPCB) or a PCB formed of FR4 may be used.

The cover 430 may be formed in a cylindrical shape to surround the lower surface of the body 410, but the disclosure is not limited thereto.

The cover 430 protects the light emitting device module 440 installed therein from external foreign substances. Further, the cover 430 may include light diffusing particles to prevent glare of light emitted from the light emitting device packages 444 and to uniformly discharge light to the outside, and a prism pattern may be formed on at least one of the inner surface and the outer surface of the cover 430. Further, a phosphor may be applied to at least one of the inner surface and the outer surface of the cover 430.

The cover 430 has excellent light transmittance so as to discharge light emitted from the light emitting device packages 444 to the outside through the cover 430, and has sufficient heat resistance so as to withstand heat generated by the light emitting device packages 444. Therefore, the cover 430 may be formed of a material including polyethylene terephthalate (PET), polycarbonate (PC) or polymethylmethacrylate (PMMA).

The end caps 450 may be located at both ends of the body 410 and be used to seal a power supply device (not shown). Further, power pins 452 are formed on the end caps 450, and thus the lighting apparatus 400 in accordance with this embodiment may be attached directly to terminals, from which a conventional fluorescent lamp has been removed, without a separate device.

Figure 11:
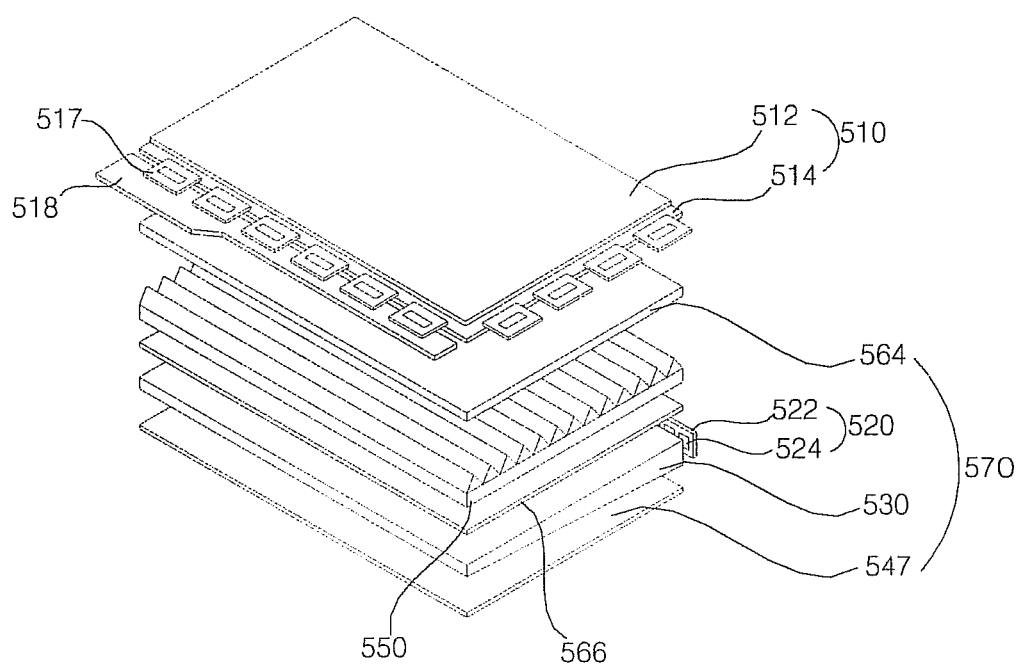
FIG. 11 is an exploded perspective of a liquid crystal display apparatus including a light emitting device array in accordance with a first embodiment.

FIG. 11 is an exploded perspective of a liquid crystal display apparatus including a light emitting device array in accordance with a first embodiment; and FIG. 11 illustrates an edge light-type liquid crystal display apparatus 500, and the liquid crystal display apparatus 500 may include a liquid crystal display panel 510 and a backlight unit 570 to supply light to the liquid crystal display panel 510.

The liquid crystal display panel 510 may display an image using light supplied from the backlight unit 570. The liquid crystal display panel 510 may include a color filter substrate 512 and a thin film transistor substrate 514 arranged opposite each other under the condition that liquid crystals are interposed therebetween.

The color filter substrate 512 may produce color of the image displayed through the liquid crystal display panel 510.

The thin film transistor substrate 514 is electrically connected to a printed circuit board 518 on which a plurality of circuit parts is mounted through a drive film 517. The thin film transistor substrate 514 may apply drive voltage supplied from the printed circuit board 518 to the liquid crystals in response to a drive signal supplied from the printed circuit board 518.

The thin film transistor substrate 514 may include thin film transistors and pixel electrodes formed on a substrate formed of a transparent material, such as glass or plastic.

The backlight unit 570 includes a light emitting device module 520 outputting light, a light guide panel 530 to convert light supplied from the light emitting device module 520 into surface light and then to supply the surface light to the liquid crystal display panel 510, a plurality of films 550, 564 and 566 to uniformize brightness distribution of light supplied from the light guide panel 530 and to improve vertical incidence, and a reflective sheet 540 to reflect light emitted from the rear surface of the light guide panel 530 back to the light guide panel 530.

The light emitting device module 520 may include a plurality of light emitting device packages 524, and a PCB 522 on which the plural light emitting device packages 524 are mounted to form an array.

The plural films 550, 564 and 566 of the backlight unit 570 may include a diffusion film 566 to diffuse light incident from the light guide panel 530 toward the liquid crystal display panel 510, a prism film 550 to concentrate diffused light to improve vertical incidence, and a protective film 564 to protect the prism film 550.

Figure 12:
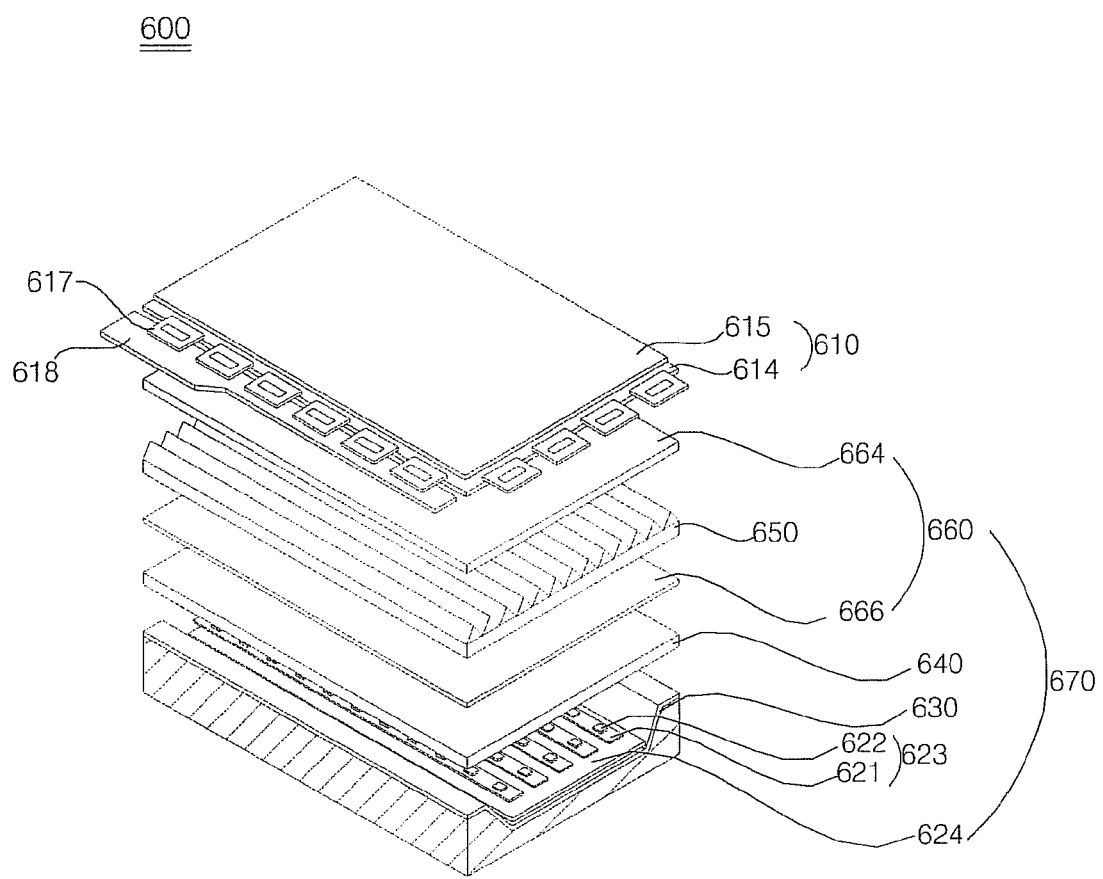
FIG. 12 is an exploded perspective of a liquid crystal display apparatus including a light emitting device array in accordance with a second embodiment.

FIG. 12 is an exploded perspective of a liquid crystal display apparatus including a light emitting device array in accordance with a second embodiment.

Here, a description of components of FIG. 12 which are substantially the same as those of FIG. 11 will be omitted.

FIG. 12 illustrates a direct-type liquid crystal display apparatus 600, and the liquid crystal display apparatus 600 may include a liquid crystal display panel 610 and a backlight unit 670 to supply light to the liquid crystal display panel 610.

The liquid crystal display panel 610 is the same as the liquid crystal display panel 510 of FIG. 11, and a detailed description thereof will thus be omitted.

The backlight unit 670 may include a plurality of light emitting device modules 623, a reflective sheet 624, a bottom chassis 630 in which the light emitting device modules 623 and the reflective sheet 624 are received, a diffusion plate 640 arranged above the light emitting device modules 623, and a plurality of optical films 660.

The light emitting device module 623 may include a plurality of light emitting device packages 622, and a PCB 621 on which the plurality of light emitting device packages 622 is mounted to form an array.

The reflective sheet 624 reflects light emitted from the light emitting device packages 622 toward the liquid crystal display panel 610, thus improving light efficiency.

Light emitted from the light emitting device modules 623 is incident upon the diffusion plate 640, and the optical films 660 are arranged above the diffusion plate 640. The optical films 660 include a diffusion film 666, a prism film 650 and a protective film 664.

Here, lighting systems may include the lighting apparatus 400 and the liquid crystal display apparatuses 500 and 600, and may include other apparatuses including light emitting device packages and operated for the purpose of lighting.

As is apparent from the above description, a light emitting device array in accordance with one embodiment is provided with a heat dissipation pattern which is arranged on a substrate absorbing heat generated from light emitting device packages during emitting light to indirectly absorb heat absorbed by the substrate and heat generated from the light emitting device packages and then to dissipate the absorbed heat in air, thereby improving reliability of the light emitting device packages.

Further, the light emitting device array in accordance with the embodiment is provided with a thermally conductive member arranged on the heat dissipation pattern, thereby facilitating absorption of heat through the substrate and the light emitting device packages.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device array comprising:
    a light emitting device package comprises a light emitting device and a body comprises first and second lead frames electrically connected to the light emitting device; and
    a substrate on which the light emitting device package is disposed, the substrate comprises a base layer and a metal layer disposed on the base layer and electrically connected to the light emitting device package,
    wherein the metal layer includes:
        first and second electrode patterns electrically connected to the first and second lead frames; and
        a heat dissipation pattern insulated from at least one of the first and second electrode patterns, the heat dissipation pattern absorbing heat generated from at least one of the base layer and the light emitting device package and then dissipating the heat,
    wherein the first lead frame includes a first overlap protrusion overlapping at least a portion of the second lead frame, wherein the first overlap protrusion includes:
        a protrusion part formed in a first direction with respect to a surface of the second lead frame, wherein a length of the protrusion part is 1 to 4 times a thickness of the light emitting device; and
an extension part extending from the protrusion part in a second direction transverse to the first direction.

2. The light emitting device array of claim 1, wherein a length of the extension part is 1.1 to 3 times a separation distance between the first and second lead frames.

3. The light emitting device array of claim 1, wherein the second lead frame includes a second overlap protrusion overlapping at least a portion of the first lead frame, and the second overlap protrusion separated from the first overlap protrusion.

4. The light emitting device array of claim 3, wherein a size of the second overlap protrusion is equal to a size of the first overlap protrusion.

5. A light emitting device array comprising:
a light emitting device package comprises a light emitting device and a body comprises first and second lead frames electrically connected to the light emitting device; and
a substrate on which the light emitting device package is disposed, the substrate including a base layer, a metal layer and an insulating layer the metal layer disposed on the base layer and the metal layer to be electrically connected to the light emitting device package, and the insulating layer disposed on the metal layer,
wherein the metal layer includes:
first and second electrode patterns electrically connected to the first and second lead frames; and
a heat dissipation pattern insulated from at least one of the first and second electrode patterns, the heat dissipation pattern absorbing heat generated from at least one of the base layer and the light emitting device package and then dissipating the heat,
wherein a length of the insulating layer is less than a length of the base layer,
wherein the insulating layer includes:
first and second electrode open areas to receive the first and second electrode patterns from the metal layer, and a heat dissipation open area to receive the heat dissipation pattern,
wherein a width of the insulating layer is less than a width of the base layer.

6. A light emitting device array comprising:
a light emitting device package comprises a light emitting device and a body comprises first and second lead frames electrically connected to the light emitting device; and
a substrate on which the light emitting device package is disposed, the substrate including a base layer, a metal layer and an insulating layer the metal layer disposed on the base layer and the metal layer to be electrically connected to the light emitting device package, and the insulating layer disposed on the metal layer,
wherein the metal layer includes:
first and second electrode patterns electrically connected to the first and second lead frames; and
a heat dissipation pattern insulated from at least one of the first and second electrode patterns, the heat dissipation pattern absorbing heat generated from at least one of the base layer and the light emitting device package and then dissipating the heat,
wherein a length of the insulating layer is less than a length of the base layer,
wherein the insulating layer includes:
first and second electrode open areas to receive the first and second electrode patterns from the metal layer, and a heat dissipation open area to receive the heat dissipation pattern,
wherein the first lead frame includes a first overlap protrusion overlapping at least a portion of the second lead frame, wherein the first overlap protrusion includes:
a protrusion part formed in a first direction with respect to a surface of the second lead frame; and
an extension part extending from the protrusion part in a second direction transverse to the first direction.

7. The light emitting device array of claim 6, wherein a length of the protrusion part is 1 to 4 times a thickness of the light emitting device.

8. The light emitting device array of claim 6, wherein a length of the extension part is 1.1 to 3 times a separation distance between the first and second lead frames.

9. The light emitting device array of claim 3, wherein a size of the second overlap protrusion is smaller than a size of the first overlap protrusion.

10. The light emitting device array of claim 3, wherein the second overlap protrusion includes:
another protrusion part formed in a third direction with respect to a surface of the first lead frame; and
another extension part extending from the another protrusion part in a fourth direction transverse to the third direction.

11. A light emitting device array comprising:
a light emitting device package comprises a light emitting device and a body comprises first and second lead frames electrically connected to the light emitting device; and
a substrate on which the light emitting device package is disposed, the substrate comprises a base layer and a metal layer disposed on the base layer and electrically connected to the light emitting device package,
wherein the metal layer includes:
first and second electrode patterns electrically connected to the first and second lead frames; and
a heat dissipation pattern insulated from at least one of the first and second electrode patterns, the heat dissipation pattern absorbing heat generated from at least one of the base layer and the light emitting device package and then dissipating the heat,
wherein the first lead frame includes a first overlap protrusion overlapping at least a portion of the second lead frame, wherein the first overlap protrusion includes:
a protrusion part formed in a first direction with respect to a surface of the second lead frame; and
an extension part extending from the protrusion part in a second direction transverse to the first direction, wherein a length of the extension part is 1.1 to 3 times a separation distance between the first and second lead frames.

12. The light emitting device array of claim 11, wherein a length of the protrusion part is 1 to 4 times a thickness of the light emitting device.

13. The light emitting device array of claim 11, wherein the second lead frame includes a second overlap protrusion overlapping at least a portion of the first lead frame, and the second overlap protrusion separated from the first overlap protrusion.

14. The light emitting device array of claim 13, wherein a size of the second overlap protrusion is equal to a size of the first overlap protrusion.

15. The light emitting device array of claim 13, wherein a size of the second overlap protrusion is smaller than a size of the first overlap protrusion.

16. The light emitting device array of claim 13, wherein the second overlap protrusion includes:
   another protrusion part formed in a third direction with respect to a surface of the first lead frame; and
   another extension part extending from the another protrusion part in a fourth direction transverse to the third direction.

* * * * *